United States Patent
Yao et al.

(10) Patent No.: US 11,716,080 B2
(45) Date of Patent: Aug. 1, 2023

(54) SMART SWITCH APPARATUS

(71) Applicant: LEEDARSON LIGHTING CO., LTD., Fujian (CN)

(72) Inventors: Huichuan Yao, Fujian (CN); Tangzhong Liu, Fujian (CN); Youxi Jiang, Fujian (CN); Shuren Cai, Fujian (CN)

(73) Assignee: LEEDARSON LIGHTING CO., LTD., Fujian (CN)

( * ) Notice: Subject to any disclaimer, the term of this patent is extended or adjusted under 35 U.S.C. 154(b) by 0 days.

(21) Appl. No.: 17/590,424

(22) Filed: Feb. 1, 2022

(65) Prior Publication Data
US 2022/0247403 A1  Aug. 4, 2022

(30) Foreign Application Priority Data
Feb. 1, 2021  (CN) .......................... 202110139055.0

(51) Int. Cl.
*H03K 17/56*  (2006.01)
*G08B 17/10*  (2006.01)
*F21V 23/04*  (2006.01)

(52) U.S. Cl.
CPC ............. *H03K 17/56* (2013.01); *F21V 23/04* (2013.01); *G08B 17/10* (2013.01)

(58) Field of Classification Search
CPC ...... H03K 17/56; H03K 17/16; H03K 17/567; H05B 47/10; H05B 47/00; F21V 23/04; G08B 17/10
See application file for complete search history.

(56) References Cited

U.S. PATENT DOCUMENTS

| | | | | |
|---|---|---|---|---|
| 6,535,369 | B1* | 3/2003 | Redding | H02H 3/05 361/111 |
| 2002/0008628 | A1* | 1/2002 | Sadjadi | G08B 5/36 340/815.45 |
| 2012/0262006 | A1* | 10/2012 | Elberbaum | H02G 3/12 307/112 |
| 2015/0016007 | A1* | 1/2015 | Zink | H01H 47/002 361/170 |
| 2020/0334974 | A1* | 10/2020 | Baker | G08C 17/00 |
| 2020/0343722 | A1* | 10/2020 | Mueller | H02H 11/004 |

* cited by examiner

*Primary Examiner* — Ojiako K Nwugo
(74) *Attorney, Agent, or Firm* — Chun-Ming Shih; Lanway IPR Services

(57) ABSTRACT

A smart switch apparatus is coupled between a live wire of an indoor power and two output terminals of a SPDT (Single Pole Double Throw) switch. Two ends of a load are respectively connected to a neutral wire of the indoor power and an input terminal of the SPDT switch. The smart switch apparatus includes an on-off status detector, a switch position detector, a controller, an on-off controller and a power circuit. The on-off status detector is coupled to the live wire of the indoor power for generating an on-off status signal. The switch position detector is coupled to the two output terminals of the SPDT switch for generating a switch position signal. The controller is coupled to the on-off status detector and the switch position detector for receiving the on-off status signal and the switch position signal. The on-off controller is coupled to the two output terminals of the SPDT switch and the live wire of the indoor power to selectively turn on or turn off the target power loop according to the on-off control signal.

20 Claims, 6 Drawing Sheets

US 11,716,080 B2

SMART SWITCH APPARATUS

FIELD

The present invention is related to a smart switch apparatus, and more particularly related to a smart switch apparatus coupled to a traditional switch.

BACKGROUND

The time when the darkness is being lighten up by the light, human have noticed the need of lighting up this planet. Light has become one of the necessities we live with through the day and the night. During the darkness after sunset, there is no natural light, and human have been finding ways to light up the darkness with artificial light. From a torch, candles to the light we have nowadays, the use of light have been changed through decades and the development of lighting continues on.

Early human found the control of fire which is a turning point of the human history. Fire provides light to bright up the darkness that have allowed human activities to continue into the darker and colder hour of the hour after sunset. Fire gives human beings the first form of light and heat to cook food, make tools, have heat to live through cold winter and lighting to see in the dark.

Lighting is now not to be limited just for providing the light we need, but it is also for setting up the mood and atmosphere being created for an area. Proper lighting for an area needs a good combination of daylight conditions and artificial lights. There are many ways to improve lighting in a better cost and energy saving. LED lighting, a solid-state lamp that uses light-emitting diodes as the source of light, is a solution when it comes to energy-efficient lighting. LED lighting provides lower cost, energy saving and longer life span.

The major use of the light emitting diodes is for illumination. The light emitting diodes is recently used in light bulb, light strip or light tube for a longer lifetime and a lower energy consumption of the light. The light emitting diodes shows a new type of illumination which brings more convenience to our lives. Nowadays, light emitting diode light may be often seen in the market with various forms and affordable prices.

After the invention of LEDs, the neon indicator and incandescent lamps are gradually replaced. However, the cost of initial commercial LEDs was extremely high, making them rare to be applied for practical use. Also, LEDs only illuminated red light at early stage. The brightness of the light only could be used as indicator for it was too dark to illuminate an area. Unlike modern LEDs which are bound in transparent plastic cases, LEDs in early stage were packed in metal cases.

In 1878, Thomas Edison tried to make a usable light bulb after experimenting different materials. In November 1879, Edison filed a patent for an electric lamp with a carbon filament and keep testing to find the perfect filament for his light bulb. The highest melting point of any chemical element, tungsten, was known by Edison to be an excellent material for light bulb filaments, but the machinery needed to produce super-fine tungsten wire was not available in the late 19th century. Tungsten is still the primary material used in incandescent bulb filaments today.

Early candles were made in China in about 200 BC from whale fat and rice paper wick. They were made from other materials through time, like tallow, spermaceti, colza oil and beeswax until the discovery of paraffin wax which made production of candles cheap and affordable to everyone. Wick was also improved over time that made from paper, cotton, hemp and flax with different times and ways of burning. Although not a major light source now, candles are still here as decorative items and a light source in emergency situations. They are used for celebrations such as birthdays, religious rituals, for making atmosphere and as a decor.

Illumination has been improved throughout the times. Even now, the lighting device we used today are still being improved. From the illumination of the sun to the time when human can control fire for providing illumination which changed human history, we have been improving the lighting source for a better efficiency and sense. From the invention of candle, gas lamp, electric carbon arc lamp, kerosene lamp, light bulb, fluorescent lamp to LED lamp, the improvement of illumination shows the necessity of light in human lives.

There are various types of lighting apparatuses. When cost and light efficiency of LED have shown great effect compared with traditional lighting devices, people look for even better light output. It is important to recognize factors that can bring more satisfaction and light quality and flexibility.

IoT (Internet of Things) need smart controls to enhance various functions. However, most places still use traditional switch and power loops.

It is therefore beneficial to design a smart switch that is easily to be integrated with traditional switch to provide flexible and various functions.

SUMMARY

In some embodiments, a smart switch apparatus includes an on-off status detector, a switch position detector, a controller, an on-off controller and a power circuit.

A smart switch apparatus is coupled between a live wire of an indoor power and two output terminals of a SPDT (Single Pole Double Throw) switch.

Two ends of a load are respectively connected to a neutral wire of the indoor power and an input terminal of the SPDT switch.

The on-off status detector is coupled to the live wire of the indoor power for generating an on-off status signal.

The on-off status signal indicates an on-off connection status between the live wire and the load.

The switch position detector is coupled to the two output terminals of the SPDT switch for generating a switch position signal.

The switch position signal indicates which one of the two output terminals of the SPDT switch is a target terminal connected to the input terminal of the SPDT.

The controller is coupled to the on-off status detector and the switch position detector for receiving the on-off status signal and the switch position signal.

The controller also receives an on-off command.

The controller generates an on-off control signal of a target power loop according to the on-off status signal, the switch position signal and the on-off command.

The target power loop corresponds to a power loop of the target terminal.

The on-off controller is coupled to the two output terminals of the SPDT switch and the live wire of the indoor power to selectively turn on or turn off the target power loop according to the on-off control signal.

a power circuit coupled to the target terminal and the live wire to supply power to the on-off controller, the controller, the switch position detector and the on-off status detector.

In some embodiments, the power circuit includes an AC-DC converter unit and a voltage stabilizer unit.

The AC-DC converter unit is connected to the live wire and the target terminal.

The AC-DC converter outputs a DC power to the voltage stabilizer unit when the target power loop is cut.

In some embodiments, the voltage stabilizer unit converts the DC power to working power supplied to the on-off status detector, the controller and the on-off controller and the switch position detector.

In some embodiments, the on-off status detector is connected to the voltage stabilizer unit for outputting the DC power to the voltage stabilizer unit.

In some embodiments, the on-off switch controller includes a relay driver and a relay.

In some embodiments, an input of the relay driver is connected to the controller.

An output of the relay driver is coupled to the relay.

The relay driver turns on or turns off the target power loop according to the on-off control signal.

In some embodiments, the smart switch apparatus may also include a wireless circuit.

The wireless circuit receives the on-off command and provides the on-off command to the controller.

In some embodiments, the on-off command includes an authentication key.

The controller determines whether the authentication key is correct before generating the on-off control signal.

In some embodiments, the on-off command includes a target identification.

The controller determines whether the target identification is associated with the controller before generating the on-off control signal.

In some embodiments, the on-off command includes a schedule.

The controller decodes the schedule and generates corresponding on-off control signals according to the schedule sequentially over time.

In some embodiments, the controller transmits a new on-off command to an external device via the wireless circuit.

In some embodiments, the smart switch apparatus may also include a switch button.

The switch button is operated to generate the on-off command supplied to the controller.

In some embodiments, the smart switch apparatus may also include a light source.

The power circuit supplies power to the light source.

In some embodiments, the smart switch apparatus may also include an environment detector.

The power circuit supplies power to the environment detector.

The environment detector generates the on-off command to the controller.

In some embodiments, the environment detector includes a motion sensor to detect whether there is an object approaching.

In some embodiments, the environment detector includes a smoke detector to detect a fire alarm situation to generate the on-off command.

In some embodiments, further includes a speaker coupled to the power circuit.

The speaker generates an alarm when the smoke detector detects the fire alarm situation.

DETAILED DESCRIPTION

When IoT (Internet of Things) is more and more popular, people expect to have more functions on their devices, e.g. smart control. It is beneficial to provide a new way to modify traditional wiring and switch combination to provide smart control.

Figure 1A:
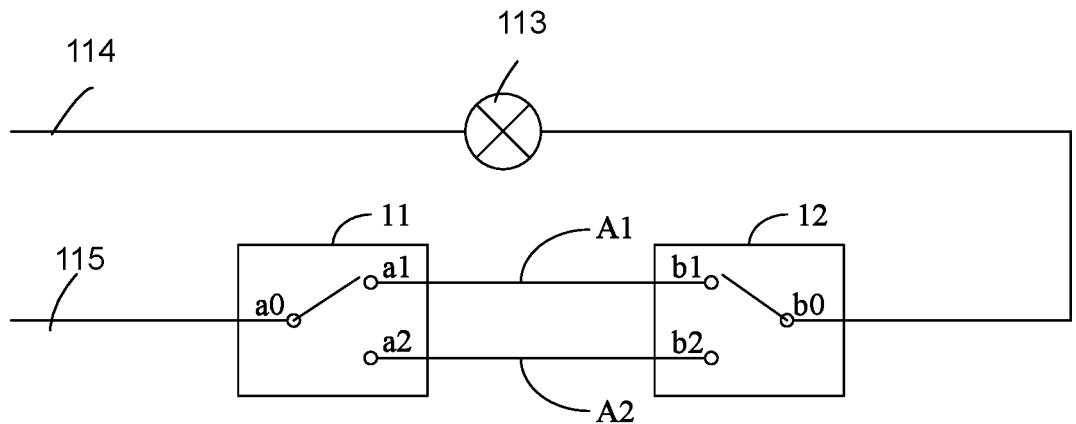
FIG. 1A illustrates a connection of two SPTD switches.

FIG. 1A shows a load 113 connected to a neutral wire 114 and two Single Pole Double Throw (SPDT) switches 11, 12 and then connected to a live wire 115.

The SPTDT switch 11 has an input terminal a0 and two output terminals a1, a2. The SPDT switch 12 has an input terminal b0 and two output terminals b1, b2.

Figure 1B:
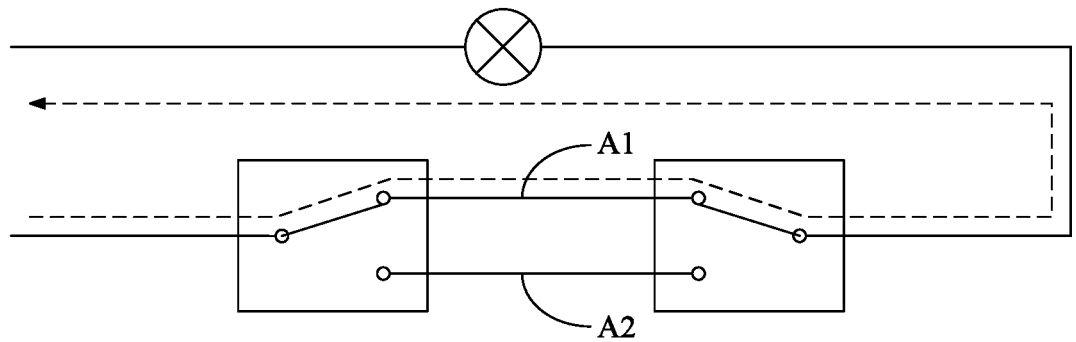
FIG. 1B illustrates a first connection of the example in FIG. 1.
Figure 1C:
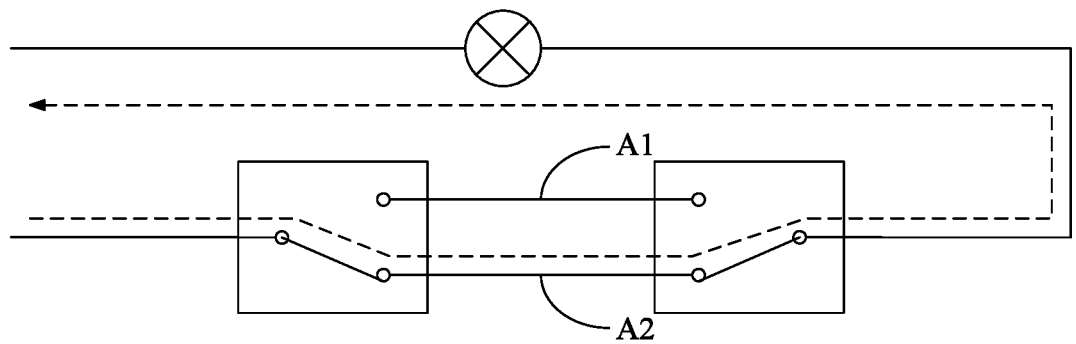
FIG. 1C illustrates a second connection of the example in FIG. 1.

FIG. 1B shows one way to conduct a target power loop. FIG. 1C shows another way to conduct another target power loop. Both the connection of FIG. 1B and FIG. 1C provide a turn-on connection. Other combination may cause turn-off connection.

The following smart switch apparatus is used to replace the SPDT switch 11. Furthermore, the smart switch apparatus adds a smart control capability, e.g. via a wireless remote control.

Figure 2:
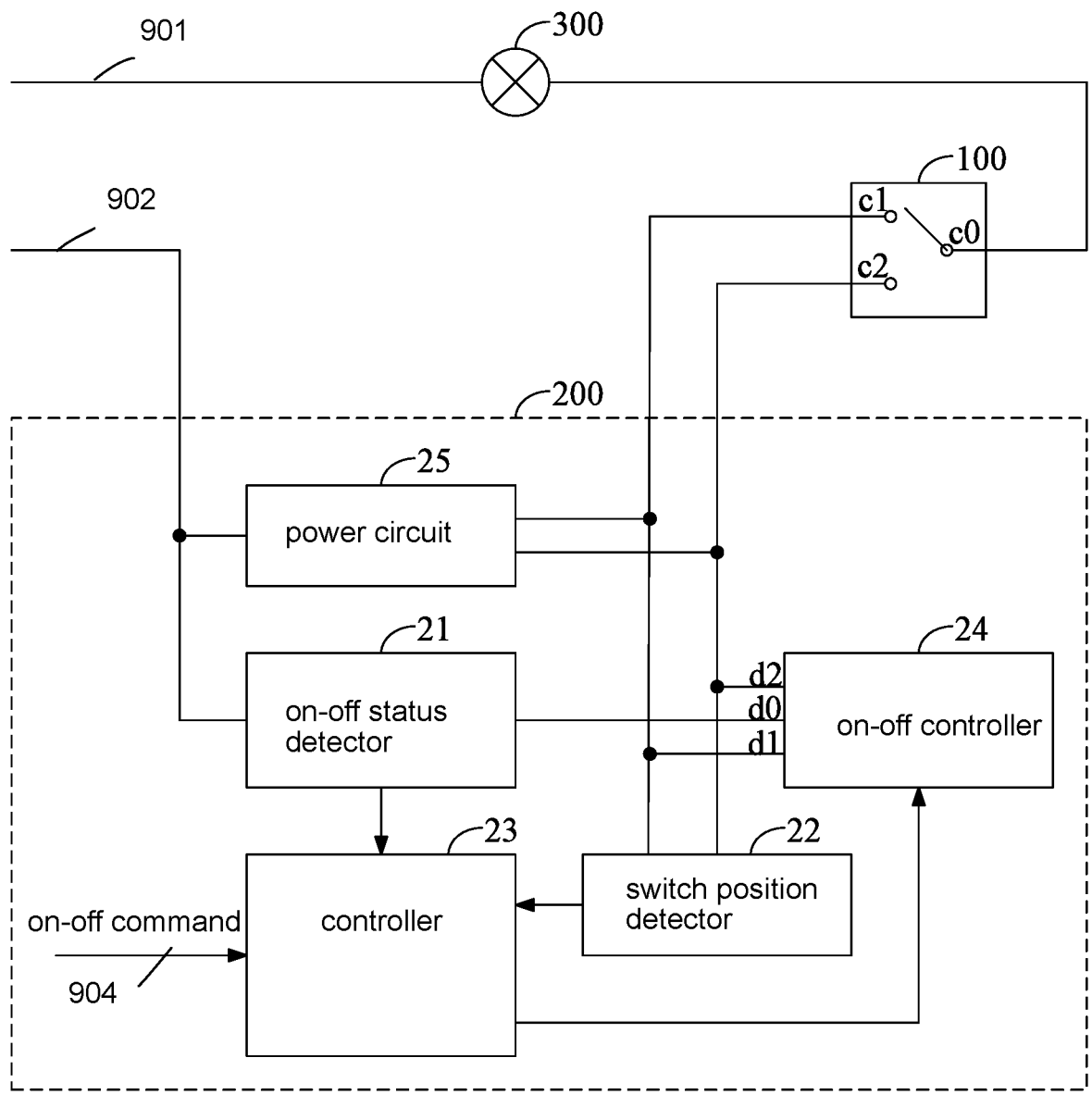
FIG. 2 illustrates an embodiment of a smart switch.

FIG. 2 shows a smart switch apparatus embodiment. In FIG. 2, the smart switch apparatus 200 is connected to a live wire 902 of an indoor power, e.g. 110V AC power, and a SPTD switch 100. A load 300 is connected to a neutral wire 901 of the indoor power and the SPTD switch 100.

The smart switch apparatus 200 includes an on-off status detector 21, a switch position detector 22, a controller 23, a on-off controller 24 and a power circuit 25.

The on-off status detector 21 is connected to the live wire 902 and the on-off controller 24. The on-off status detector 21 sends an on-off status signal to the controller 23. The on-off status signal indicates whether a power loop is turned on or turned off between the live wire 902 to the load 300.

In this embodiment, the on-off controller 24 includes a control terminal d0, a first output terminal d1 and a second output terminal d2. The on-off status detector 21 is connected to the control terminal d0 of the on-off controller 24. The first output terminal d1 and the second output terminal d2 of the on-off controller 24 are respectively connected to the first output terminal c1 and the second output terminal c2 of the SPTD switch 100.

The on-off controller 24 controls its control terminal d0 to connect either to the first output terminal d1 or the second output terminal d2. The input terminal c0 of the SPTD switch 100 may be operated to connect to either the first output terminal c1 or the second output terminal c2.

In other words, the live wire 902 and the load 300 may be connected with two power loops. One power loop is from the input terminal c0 of the SPTD switch 100, the first output terminal c1 of the SPTD switch 100, the first output terminal d1 of the on-off controller 24, and the control terminal d0 of the on-off controller 24.

Another power loop is from the input terminal c0 of the SPTD switch 100, the second output terminal c2 of the SPTD switch 100, the second output terminal d2 of the on-off controller 24, and the control terminal d0 of the on-off controller 24 are connected.

The on-off status detector 21 generates an on-off status signal by detecting any of the two power loops are conducted as the target power loop.

The two inputs of the switch position detector 22 are connected to the two output terminals c1, c2 of the SPTD switch 100 to send a switch position signal to the controller 23.

The controller 23 also receives an on-off command 904. The controller 23 generates an on-off control signal to the on-off controller 24 to switch the connection of either d0 to d2 or d0 to d1 so as to turn on or turn off power supplied to the load 300. The controller 23 makes such decision based on the on-off status signal, the switch position signal and the on-off command.

The on-off command may be provided by an on-off switch, e.g. a button, an external remote control or other devices for instructing the controller 24 to perform a corresponding operation.

Figure 3:
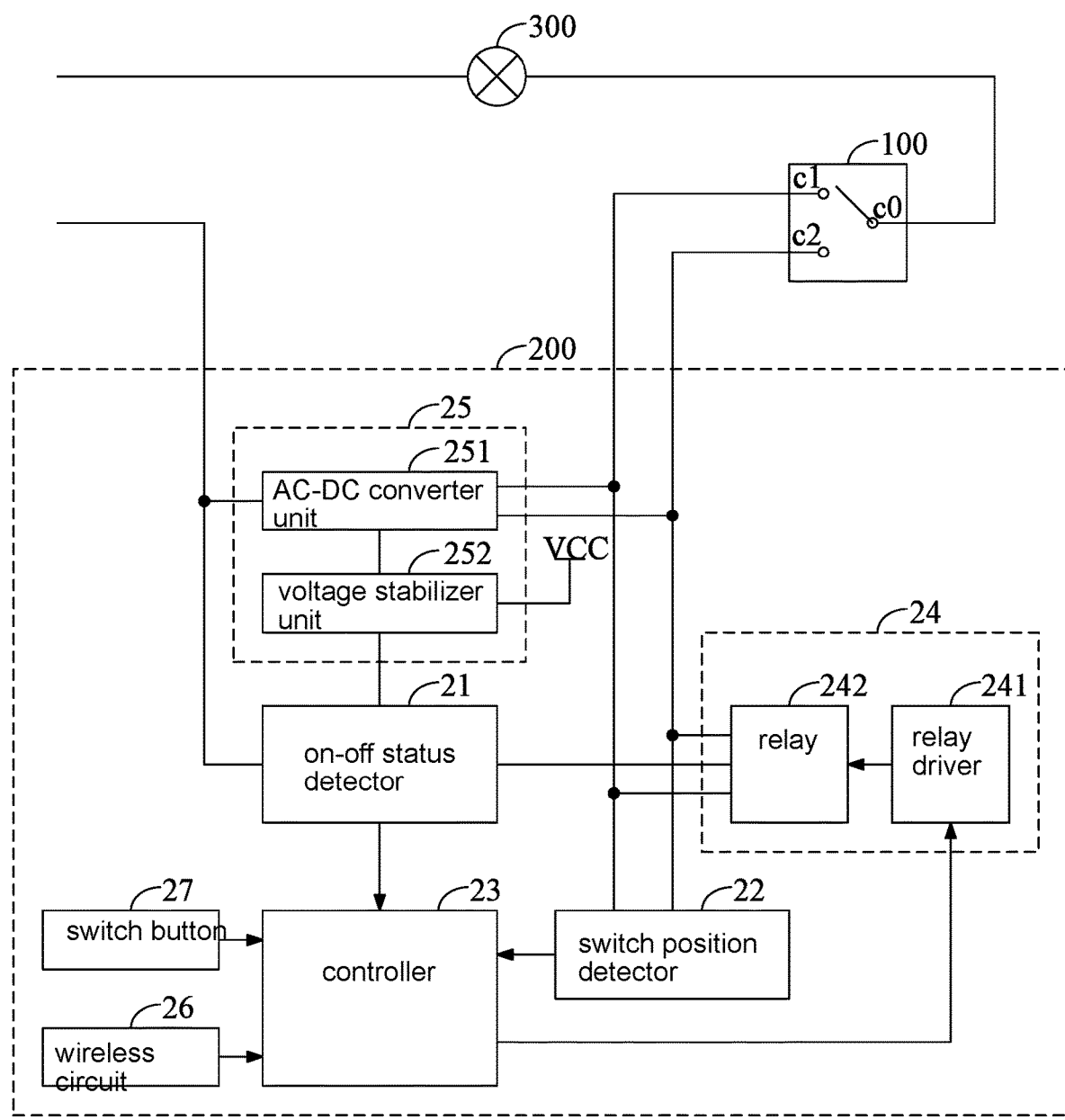
FIG. 3 illustrates another embodiment of a smart switch.

Please refer to FIG. 3, which shows a further embodiment of the example in FIG. 2.

In FIG. 3, the power circuit 25 includes an AC-DC converter unit 251 and a voltage stabilizer unit 252.

The AC-DC converter 251 is connected to the live wire and the target power loop conducted via either the output terminal c1 or the output terminal c2 of the SPTD switch 100. The AC-DC converter 251 generates a DC power no matter the on-off command is ON or OFF.

The DC power is supplied to the voltage stabilizer unit 252.

The voltage stabilizer unit 252 is connected to the AC-DC converter unit 251 for generating a working power to the controller 23, the on-off status detector 21, the switch position detector 22, and the on-off controller 24.

Even the target power loop is cut, the AC-DC converter unit 251 is still connected to the live wire 902 and the power supply to the AC-DC converter unit 251 is not interrupted.

The on-off controller 24 may include a relay driver 241 and a relay 242. The relay driver 241 drives the relay 242 to turn on or turn off the target power loop according to the on-off control signal. The relay 242 may be a magnetic relay, which may not consume electricity except during turn-on or turn-off moments.

A wireless circuit 25 may be used for receiving the on-off command, e.g. from a remote control, a mobile phone, a tablet or a server. As mentioned above, the on-off command is decoded and sent to the controller 23.

The wireless circuit 26 may be an infrared communication device, a Wireless Fidelity (WIFI) module, a Near Field Communication (NFC) device, a ZigBee device or other communication circuit.

A switch button 27 may be provided to generate the on-off command provided to the controller 23. The switch button 27 may be a mechanic switch or a touch switch.

The controller 23 may be implemented by a single-chip device, a device with a CPU, a micro-controller embedded device or other methods.

Multiple ways may be disposed at the same time to provide flexible control of the smart switch apparatus.

Figure 4:
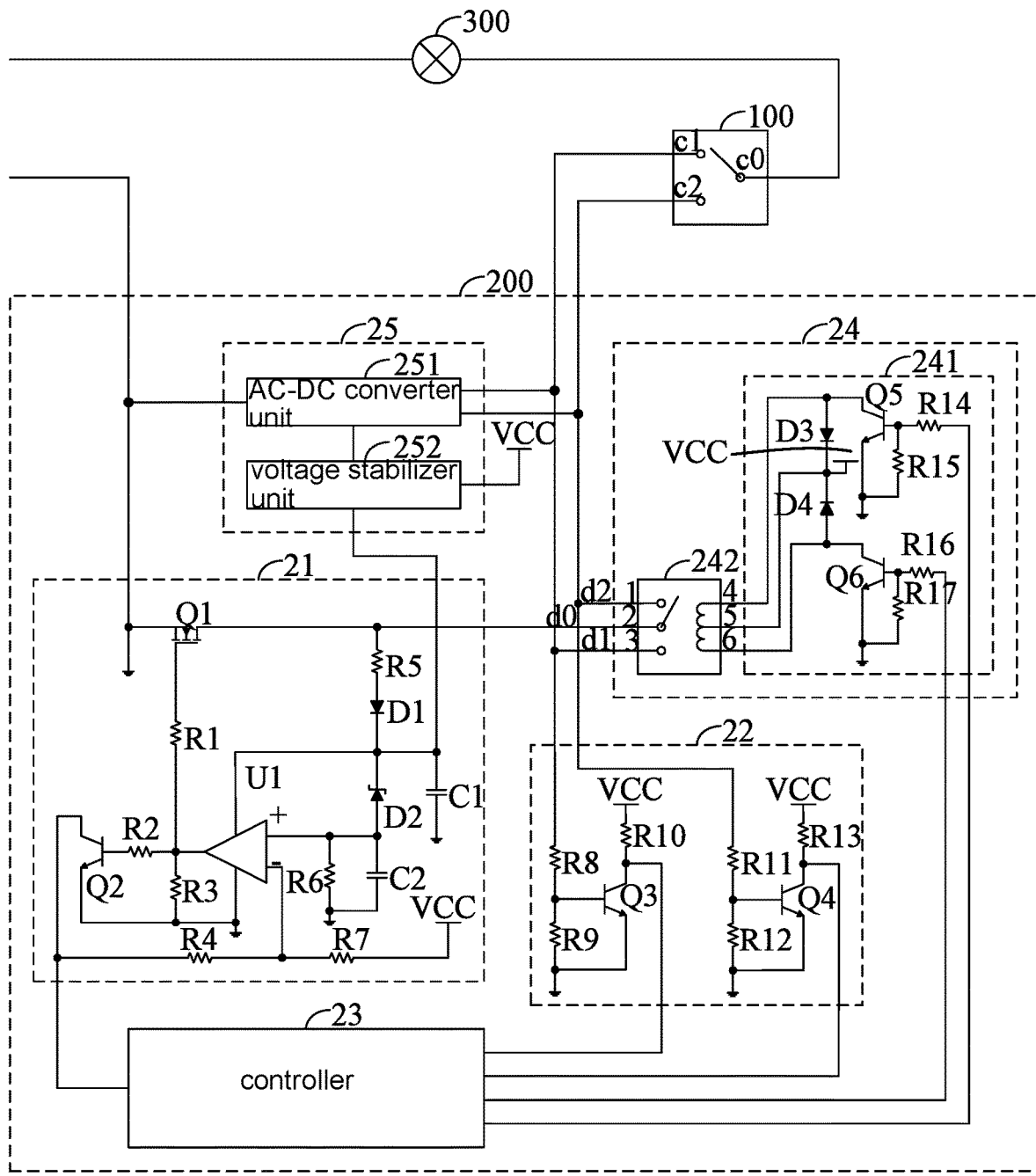
FIG. 4 illustrates a circuit example to implement a smart switch.

Please refer to FIG. 4, which shows that the on-off status detector 21 may include a first transistor Q1, a second transistor Q2, a first resistor R1, a second resistor R2, a third resistor R3, a fourth resistor R4, an OP amplifier U1, a fifth resistor R5, a first diode D1, a Zener diode D2, a sixth resistor R6, a seventh resistor R7, a first capacitor C1 and a second capacitor C2.

The first end of the first transistor Q1 is connected to the live wire. The second end of the first transistor Q1 is connected to the first end of the fifth resistor R5 and the terminal d0 of the on-off controller 24.

The second end of the fifth resistor R5 is connected to a positive end of the first diode D1. The negative end of the first diode D1, the power end of the OP amplifier U1, the negative end of the Zener diode D2, the first end of the first capacitor C1 and the input of the voltage stabilizer unit 252 are connected.

The second end of the first capacitor C1 is grounded. The positive end of the Zener diode D2, the first end of the second capacitor C2, the first end of the sixth resistor R6 and the positive end of the OP amplifier U1 are connected.

The second end of the second capacitor C2 and the second end of the sixth resistor R6 are grounded. The first end of the seventh resistor R7 is connected to the output of the voltage stabilizer 252. The second end of the seventh resistor R7, the first end of the fourth resistor R4 and the negative input of the OP amplifier U1 are connected.

The output of the OP amplifier U1, the second of the first resistor R1, the first end of the second resistor R2 and the first end of the third resistor R3 are connected.

The first end of the first resistor R1 is connected to a control end of the first resistor Q1. The second end of the second resistor R2 is connected to the control end of the second resistor Q2. The first conductive end of the second resistor Q2, the second end of the fourth resistor R4 and the controller 23 are connected. The second conductive end of the second resistor Q2, the second end of the third resistor R3 and the OP amplifier U1 are grounded.

Figure 5A:
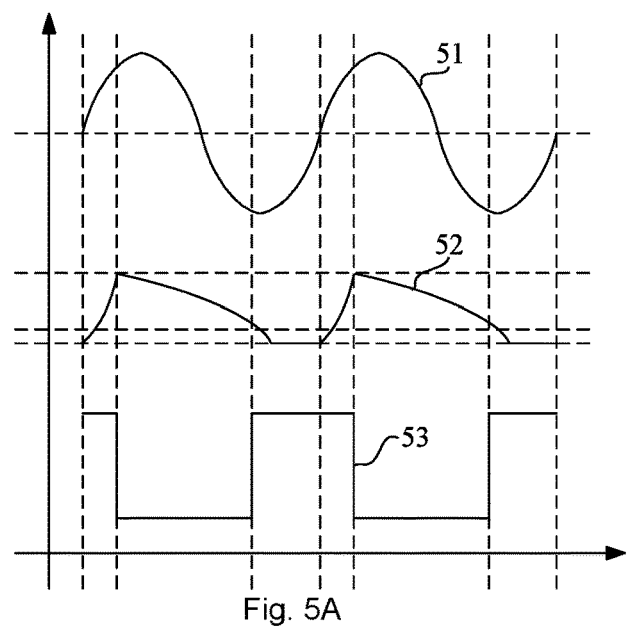
FIG. 5A illustrates a power signal diagram.

FIG. 5A shows an AC power signal 51.

The voltage wave form 52 in FIG. 5A shows a signal at the second capacitor C2.

The pulse signal 53 in FIG. 5A is generated by the second transistor Q2 to the controller 23.

Figure 5B:
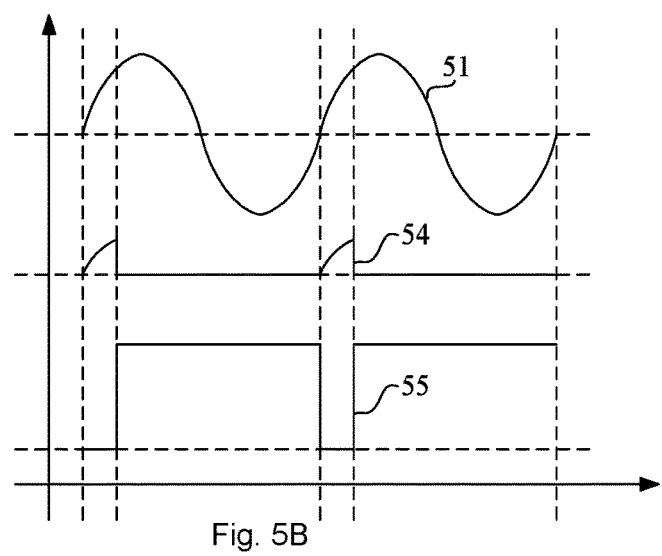
FIG. 5B illustrates another power signal diagram.
Figure 5C:
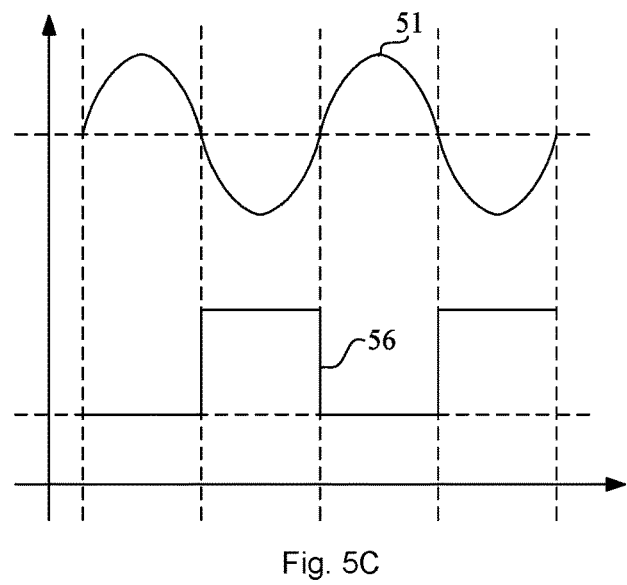
FIG. 5C illustrates another power signal diagram.

FIG. 5B and FIG. 5C show the switch position signals 54, 55, 56.

In FIG. 4, the switch position detector includes an eighth resistor R8, a ninth resistor R9, a tenth resistor R10, a third transistor Q3, an eleventh resistor R11, a twelfth resistor R12, a third resistor R13 and a fourth transistor Q4.

The first end of the eighth resistor R8 is connected to the switch position detector 22. The second end of the eighth resistor R8, the first end of the ninth resistor R9, and the control end of the third transistor Q3 are connected. The second end of the ninth resistor R9 and the second end of the third transistor Q3 are grounded. The first conductive end of the third transistor Q3 and the second end of the tenth resistor R10 are used as the first output end of the switch position detector 22. The first end of the tenth resistor R10 and the output end of the voltage stabilizer unit 252 are connected.

The first end of the eleventh resistor R11 is used as the second input of the switch position detector 22. The second end of the eleventh R11, the first end of the twelfth R12 and the control end of the fourth transistor Q4 are connected. The second end of the twelfth resistor R12 and the second conductive end of the fourth transistor Q4 are grounded. The first conductive end of the fourth transistor Q4 and the second end of the thirteenth resistor R13 are used as the second output end of the switch position detector 22. The first end of the thirteenth resistor R13 is connected to an output of the voltage stabilizer unit 252. The first end of the switch position detector 22 and the second end of the switch position detector 22 are both connected to the controller 23.

Figure 6:
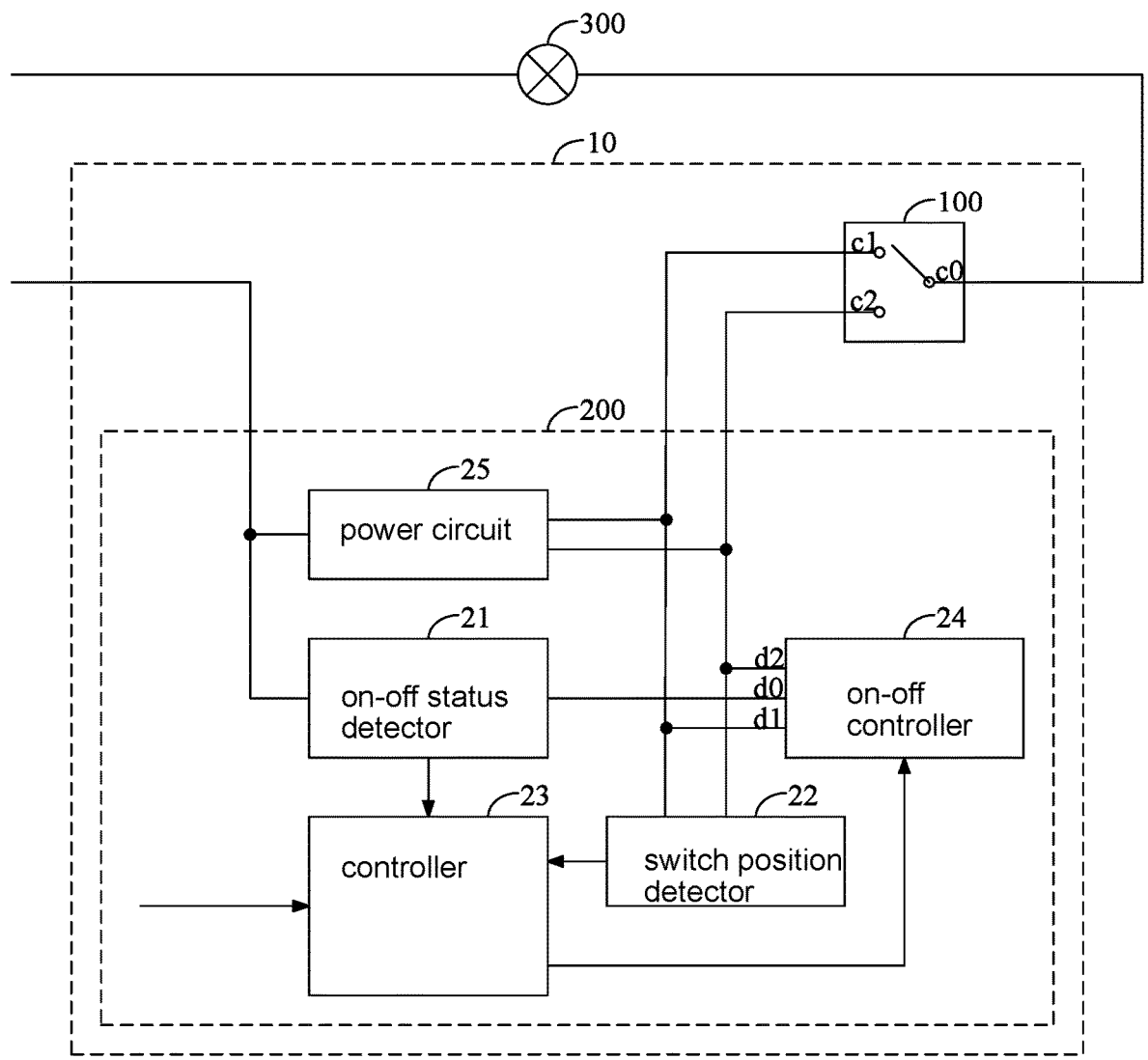
FIG. 6 illustrates another smart switch embodiment.

FIG. 6 shows another embodiment in which the SPTD switch 100 is integrated with other components of the smart switch apparatus mentioned above as a device. In other words, in FIG. 6, the smart switch apparatus 10 includes the SPTD switch 10.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings.

In some embodiments, the on-off command includes an authentication key.

The controller determines whether the authentication key is correct before generating the on-off control signal. For example, the controller 23 may implement an RSA decoder or other decryption methods. It is important to add security confirmation particularly in the field of wireless IoT applications.

In some embodiments, the on-off command includes a target identification.

The controller determines whether the target identification is associated with the controller before generating the on-off control signal.

In some embodiments, the on-off command includes a schedule.

The controller decodes the schedule and generates corresponding on-off control signals according to the schedule sequentially over time. For example, a schedule may indicate to turn on a light between 8:00 and 11:00 and then to turn off between 11:00 and 13:00, and then turn on again between 13:00 to 17:00.

In some embodiments, the controller transmits a new on-off command to an external device via the wireless circuit.

The embodiments were chosen and described in order to best explain the principles of the techniques and their practical applications. Others skilled in the art are thereby enabled to best utilize the techniques and various embodiments with various modifications as are suited to the particular use contemplated.

Although the disclosure and examples have been fully described with reference to the accompanying drawings, it is to be noted that various changes and modifications will become apparent to those skilled in the art. Such changes and modifications are to be understood as being included within the scope of the disclosure and examples as defined by the claims.

The invention claimed is:

1. A smart switch apparatus coupled between a live wire of an indoor power and two output terminals of a SPDT (Single Pole Double Throw) switch, two ends of a load are respectively connected to a neutral wire of the indoor power and an input terminal of the SPDT switch, the smart switch apparatus comprising:

an on-off status detector coupled to the live wire of the indoor power for generating an on-off status signal, wherein the on-off status signal indicates an on-off connection status between the live wire and the load;

a switch position detector coupled to the two output terminals of the SPDT switch for generating a switch position signal, wherein the switch position signal indicates which one of the two output terminals of the SPDT switch being a target terminal connected to the input terminal of the SPDT;

a controller coupled to the on-off status detector and the switch position detector for receiving the on-off status signal and the switch position signal, wherein the controller also receives an on-off command, wherein the controller generates an on-off control signal of a target power loop according to the on-off status signal, the switch position signal and the on-off command, wherein the target power loop corresponds to a power loop of the target terminal;

an on-off controller coupled to the two output terminals of the SPDT switch and the live wire of the indoor power to selectively turn on or turn off the target power loop according to the on-off control signal; and a power circuit coupled to the target terminal and the live wire to supply power to the on-off controller, the controller, the switch position detector and the on-off status detector.

2. The smart switch apparatus of claim 1, wherein the power circuit comprises an ACDC converter unit and a voltage stabilizer unit, wherein the AC-DC converter unit is connected to the live wire and the target terminal, wherein the AC-DC converter outputs a DC power to the voltage stabilizer unit when the target power loop is cut.

3. The smart switch apparatus of claim 2, wherein the voltage stabilizer unit converts the DC power to working power supplied to the on-off status detector, the controller and the on-off controller and the switch position detector.

4. The smart switch apparatus of claim 1, wherein the on-off status detector is connected to the voltage stabilizer unit for outputting the DC power to the voltage stabilizer unit.

5. The smart switch apparatus of claim 1, wherein the on-off switch controller comprises a relay driver and a relay.

6. The smart switch apparatus of claim 5, wherein an input of the relay driver is connected to the controller, wherein an output of the relay driver is coupled to the relay, wherein the relay driver turns on or turns off the target power loop according to the on-off control signal.

7. The smart switch apparatus of claim 1, further comprising a wireless circuit, wherein the wireless circuit receives the on-off command and provides the on-off command to the controller.

8. The smart switch apparatus of claim 7, wherein the on-off command comprises an authentication key, wherein the controller determines whether the authentication key is correct before generating the on-off control signal.

9. The smart switch apparatus of claim 7, wherein the on-off command comprises a target identification, wherein the controller determines whether the target identification is associated with the controller before generating the on-off control signal.

10. The smart switch apparatus of claim 7, wherein the on-off command comprises a schedule, wherein the controller decodes the schedule and generates corresponding on-off control signals according to the schedule sequentially over time.

11. The smart switch apparatus of claim 7, wherein the controller transmits a new on-off command to an external device via the wireless circuit.

12. The smart switch apparatus of claim 1, further comprising a switch button, wherein the switch button is operated to generate the on-off command supplied to the controller.

13. The smart switch apparatus of claim 1, wherein the on-off status detector comprises a first transistor Q1, a second transistor Q2, a first resistor R1, a second resistor R2, a third resistor R3, a fourth resistor R4, an OP amplifier U1, a fifth resistor R5, a first diode D1, a Zener diode D2, a sixth resistor R6, a seventh resistor R7, a first capacitor C1 and a second capacitor C2.

14. The smart switch apparatus of claim 1, wherein the switch position detector comprises, the switch position detector includes an eighth resistor R8, a ninth resistor R9, a tenth resistor R10, a third transistor Q3, an eleventh resistor R11, a twelfth resistor R12, a third resistor R13 and a fourth transistor Q4.

15. The smart switch apparatus of claim 1, wherein the relay driver comprises transistors to decode signal input from the controller.

16. The smart switch apparatus of claim 1, further comprising a light source, wherein the power circuit supplies power to the light source.

17. The smart switch apparatus of claim 1, further comprising an environment detector, wherein the power circuit supplies power to the environment detector, wherein the environment detector generates the on-off command to the controller.

18. The smart switch apparatus of claim 17, wherein the environment detector comprises a motion sensor to detect whether there is an object approaching.

19. The smart switch apparatus of claim 17, wherein the environment detector comprises a smoke detector to detect a fire alarm situation to generate the on-off command.

20. The smart switch apparatus of claim 19, further comprises a speaker coupled to the power circuit, wherein the speaker generates an alarm when the smoke detector detects the fire alarm situation.

\* \* \* \* \*